United States Patent
Miettinen

(10) Patent No.: US 6,175,256 B1
(45) Date of Patent: Jan. 16, 2001

(54) CONTROL CIRCUIT

(75) Inventor: Erkki Miettinen, Helsinki (FI)

(73) Assignee: ABB Industry Oy, Helinski (FI)

( * ) Notice: Under 35 U.S.C. 154(b), the term of this patent shall be extended for 0 days.

(21) Appl. No.: 09/425,957

(22) Filed: Oct. 25, 1999

(30) Foreign Application Priority Data

Nov. 11, 1998 (FI) ........................................................ 982447

(51) Int. Cl.[7] .............................. H03B 1/00; H03K 3/00
(52) U.S. Cl. ........................................... 327/108; 327/112
(58) Field of Search ................................. 327/108, 109, 327/110, 111, 112, 421, 326, 502, 580, 584; 326/82, 83, 87

(56) References Cited

U.S. PATENT DOCUMENTS

| | | | | |
|---|---|---|---|---|
| 5,939,908 | * | 8/1999 | Moore et al. ........................ | 327/108 |
| 5,952,856 | * | 9/1999 | Horiguchi et al. ................... | 327/110 |
| 5,986,832 | * | 11/1999 | Barnett ................................. | 360/46 |
| 5,990,710 | * | 11/1999 | Ngo et al. ............................ | 327/110 |
| 6,040,721 | * | 3/2000 | Fischer et al. ....................... | 327/110 |
| 6,087,862 | * | 7/2000 | Williams .............................. | 327/108 |

* cited by examiner

*Primary Examiner*—My-Trang Nuton
(74) *Attorney, Agent, or Firm*—Dykema Gossett PLLC

(57) ABSTRACT

A control circuit for controlling a power semiconductor, the control circuit comprising a gate driver comprising a control input, auxiliary voltage inputs and an output. The control circuit further comprises a first semiconductor switch comprising a control electrode and main electrodes, a first main electrode forming a positive input pole of the control circuit and a second forming an output of the control circuit; a second semiconductor switch comprising a control electrode and main electrodes, a first main electrode forming a negative input pole of the control circuit and a second being connected to the output of the control circuit; a first resistance, a second resistance, a first zener diode whose anode is connected to the output of the gate driver and whose cathode to the positive input pole of the control circuit; and a second zener diode whose cathode is connected to the output of the gate driver and whose anode to the negative input pole of the control circuit.

3 Claims, 1 Drawing Sheet

CONTROL CIRCUIT

BACKGROUND OF THE INVENTION

The present invention relates to a control circuit for controlling a power semiconductor, the control circuit comprising a gate driver comprising a control input, auxiliary voltage inputs and an output.

For some time, gate drivers equipped with optical isolation have been commercially available that can be used for controlling at most an approximately 100-ampere power semiconductor, such as an IGBT or FET. The reason for the limited power semiconductor rating is the limited current output capacity of a gate driver, which makes it impossible to control high-current power semiconductors in a reliable manner. Because of the above-mentioned problem, using such a gate driver necessitates a separate amplifier stage by means of which the current feeding capacity can be made to satisfy the needs of larger power semiconductors as well.

BRIEF DESCRIPTION OF THE INVENTION

An object of the present invention is to provide a control circuit avoiding the disadvantages mentioned above, also enabling high-current power semiconductors to be controlled in a reliable manner while employing a simple circuit. This object is achieved by a control circuit in accordance with the invention, the control circuit being characterized in that the control circuit further comprises a first semiconductor switch comprising a control electrode and main electrodes, a first main electrode forming the positive input pole of the control circuit and a second main electrode forming the output of the control circuit; a second semiconductor switch comprising a control electrode and main electrodes, a first main electrode forming the negative input pole of the control circuit and a second main electrode being connected to the output of the control circuit; a first resistance whose first pole is connected to the positive auxiliary voltage input of the gate driver and whose second pole is connected to the positive input pole of the control circuit, the positive auxiliary voltage input being arranged to control the first semiconductor switch; a second resistance whose first pole is connected to the negative auxiliary voltage input of the gate driver and whose second pole is connected to the negative input pole of the control circuit, the negative auxiliary voltage input being arranged to control the second semiconductor switch; a first zener diode whose anode is connected to the output of the gate driver and whose cathode is connected to the positive input pole of the control circuit; a second zener diode whose cathode is connected to the output of the gate driver and whose anode is connected to the negative input pole of the control circuit.

The control circuit in accordance with the invention is based on the idea that the current output capacity of a gate driver is increased by utilizing a simple circuit. The control circuit comprises semiconductor switches that form an output, which is cophasal with the output of the gate driver. Current obtained tained via the semiconductor switches at the output is significantly higher than current from a mere gate driver output. Owing to the fact that the outputs are cophasal, the control circuit is unnoticeable to other components possibly connected thereto; hence, when designing other parts or sub-entities belonging to the same operational entity, it is unnecessary to take into account the addition of auxiliary components belonging to the control circuit.

BRIEF DESCRIPTION OF THE DRAWINGS

The invention is now described in closer detail in connection with the preferred embodiments with reference to the accompanying drawing, in which.

DETAILED DESCRIPTION OF THE INVENTION

Figure 1:
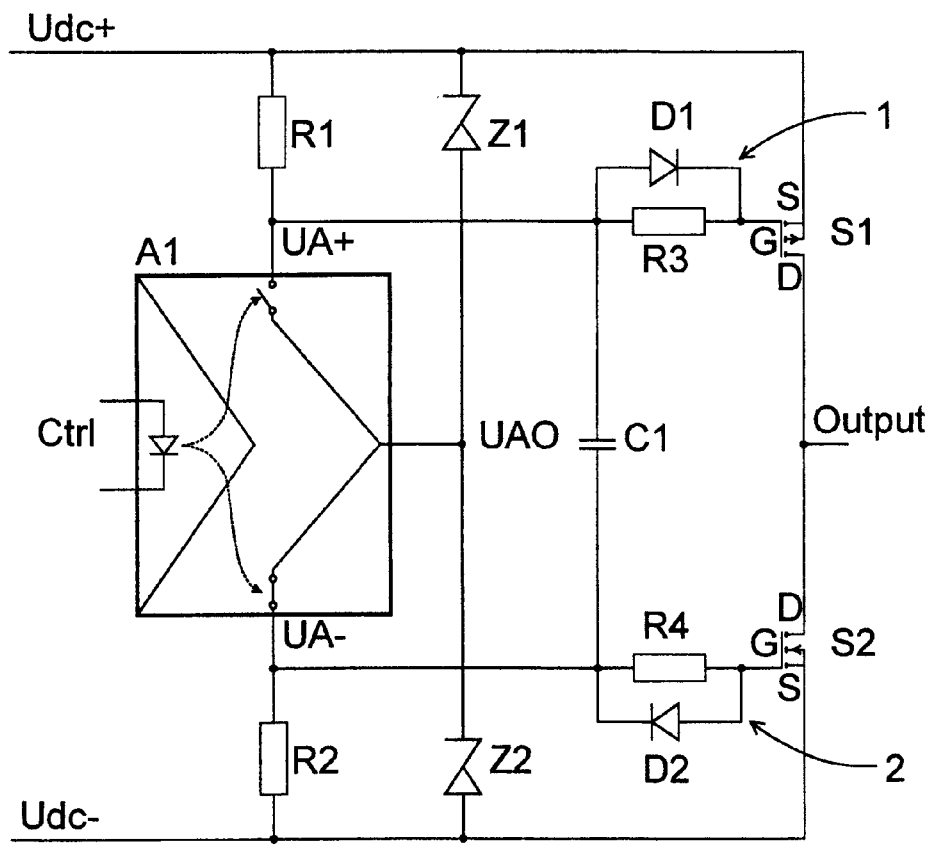
FIG. 1 shows a control circuit in accordance with a preferred embodiment of the invention.

According to FIG. 1, a control circuit in accordance with the invention vention comprises a gate driver A1. The gate driver A1 is an optically isolated gate driver, whereby a control input Ctrl is electrically isolated from other outputs puts or inputs of the gate driver. Consequently, the potential of a circuit providing the control input can vary with respect to the potential of the control circuit. The gate driver A1 further comprises a positive UA+ and a negative UA− auxiliary voltage input and an output UAO. Conventionally used, the output of the gate driver is connected to a control electrode of a power semiconductor to be controlled. Depending on the control input, a voltage connected either to the positive or the negative auxiliary voltage input is then led to the control electrode.

The control circuit of the invention further comprises a first and a second resistance R1, R2 connected to the positive and the negative auxiliary voltage input of the gate driver. A first pole of the first resistance RI is connected to the positive input UA+ of the gate driver A1, while a second pole forms a positive input pole Udc+ of the control circuit. In a corresponding way, a first pole of the second resistance is connected to the negative input UA− of the gate driver, while a second pole forms a negative input pole of the control circuit.

The control circuit further comprises a first and a second zener diode Z1, Z2. The first zener diode Z1 is connected between the output UAO of the gate driver A1 and the positive input pole Udc+ of the control circuit such that the cathode of the zener diode Z1 is connected to the positive input pole Udc+. In a corresponding manner, the second zener diode Z2 is connected between the output UAO of the gate driver A1 and the negative input pole Udc− of the control circuit. The second zener diode is connected in such a manner that its anode is connected to the negative input pole Udc−. Hence, the zener diodes are coupled in series between the positive and the negative input poles, a point between the zener diodes further being connected to the output of the gate driver.

In the manner shown by FIG. 1, the control circuit in accordance with a preferred embodiment of the invention further comprises a capacitor C1 connected between the positive and the negative auxiliary voltage inputs of the gate driver.

The control circuit of the invention comprises a first and a second semiconductor switches S1, S2 comprising a control electrode G and main electrodes S, D. The control electrode refers to the electrode by which the semiconductor component to be controlled is controlled, and the main electrodes refer to those electrodes of the component that, responsive to the control of the control electrode, carry out the control command. In the description of the invention, FET transistors are used as the semiconductor switches by way of example, but the semiconductor switch can be any other component appropriate for the purpose. When the semiconductor switch is an FET transistor, the control electrode is called a gate and the main electrodes are called a source S and a drain D. In the manner shown in FIG. 1, a first main electrode S of the first semiconductor switch is connected to the positive input pole of the control circuit, a second main electrode D forming an output Output of the control circuit. Correspondingly, a first main electrode S of the second semiconductor S2 is connected to the negative input point Udc− of the control circuit, and a second electrode D is connected to the control circuit's output Output, which, at the same time, is the second electrode D of the first semiconductor switch.

In accordance with a preferred embodiment of the invention, the control circuit further comprises two parallel connections 1, 2 of a diode and a resistance connected between the control electrodes G, i.e. the gates, of the first and the second semiconductor switches and the auxiliary voltage inputs UA+, UA− of the gate driver. The first parallel connection 1 of a diode D1 and a resistance R3 is connected between the gate of the first semiconductor switch and the positive auxiliary voltage input UA+ of the gate driver in such a manner that the anode of the diode D1 is connected to the auxiliary voltage input UA+. The second parallel connection 2 of a diode D2 and a resistance R4 is connected between the gate of the second semiconductor switch and the negative auxiliary voltage input UA− of the gate driver in such a manner that the anode of the diode D2 is connected to the gate of the semiconductor switch S2.

The control circuit of the invention generates output voltages that are cophasal with respect to control signals supplied to the control input. The output voltages are obtained from the input voltages connected to the positive and the negative input poles Udc+, Udc−. Typically, the gate driver comprises two current paths, each of which can in turn be directed to be conducting. The output of the gate driver is then connected either to the positive, or, alternatively, to the negative auxiliary voltage input. When the higher voltage path of the gate driver is controlled to be conducting, in other words when the output of the gate driver and the positive auxiliary voltage input are electrically interconnected by the internal switch parts of the gate driver, current starts flowing through the gate driver A1. The current starts advancing from the positive input pole Udc+ whereto a positive input voltage, typically of approximately 15 volts, is connected, further passing through the first resistance R1, the higher current path of the gate driver A1 and the second zener diode, reaching the negative input pole Udc− whereto a voltage of approximately −7 volts is typically connected. When voltages are as described above, the potential difference between the positive and the negative poles is approximately 22 volts.

When current follows the above-described route it causes certain voltage losses. A current flow requires a threshold voltage of the zener diode Z2 to be lower than the overall voltage applied over the zener diode. When current flows through the zener diode, a voltage corresponding to the threshold voltage remains over it. In the exemplary case, the threshold voltage of the zener diode Z2 is 13 volts. Hence, when current flows through the zener diode Z2, the voltage of its anode increases by 13 volts, i.e. to a voltage of +6 volts. When current flows through the gate driver, a voltage loss of approximately 2 volts also takes place, as a result of which the positive auxiliary voltage input UA+ of the gate driver has a voltage of +8 volts.

In the exemplary design, the resistances R1, R2 connected to the auxiliary voltage inputs of the gate driver A1 are approximately 400 ohms, whereby the idle current of the circuit causes a voltage loss approximately of 1 volt in the resistances. The idle current refers to a current which flows via an uncontrolled circuit of the gate driver. Hence, in the above-described case, the potential of the negative auxiliary voltage input of the gate driver is approximately −6 volts.

In the control circuit in accordance with the invention, the positive auxiliary voltage input UA+ of the gate driver A1 is connected to the gate G of the first semiconductor switch S1 via the parallel connection 1 of the first diode D1 and the resistance R3. According to the preferred embodiment of the invention, the first semiconductor switch S1 is a p-channel FET transistor, and the second semiconductor switch S2 is an n-channel FET transistor. When the semiconductor switch S1 is a p-channel FET transistor, it can be controlled into a conducting state by taking the gate G of the switch to a negative potential with respect to its main electrode S. In the above-described case, this is exactly what happens, since the potential of the gate G follows the potential of the positive auxiliary voltage input of the gate driver and the potential of the main electrode S is connected to a positive input voltage, which is 15 volts in the exemplary design, directly connected to the positive input pole of the control circuit. Hence, the semiconductor switch S1 is in the conducting state.

The semiconductor switch S2 is preferably of the n-channel FET transistor type, in which case rendering it into the conducting state requires a considerable positive gate voltage with respect to the main electrode S. If the gate driver is controlled as described above, the negative auxiliary voltage input UA− of the gate driver has the potential of −6 volts, the gate of the switch S2 also following this potential. The main electrode S of the switch S2 is connected to a negative input voltage connected to the negative input pole, whereby the voltage between the gate and the main electrode S is approximately 1 volt, which is not sufficient for the switch S2 to be switched on. It is thus obvious that while the higher semiconductor switch S1 conducts, the lower one S2 should be in a non-conducting state.

A purpose of the parallel connections 1, 2 of a diode and a resistance connected to the gates of the semiconductor switches S1, S2 is to delay a switch to be switched on appropriately such that a switch to be switched off has sufficiently time to be reliably transferred to a blocking state. Hence, the polarities of the diodes D1, D2 allow current of a direction necessary for switching off the semiconductor switches to pass through the diodes. Currents necessary for switch-off thus flow via the diodes, but currents necessary for switching on the switches must flow via the resistances R3, R4. The capacitor C1 serves to operate as a filtering capacitor and energy supply of the gate driver A1 by means of which the semiconductor switches are quickly switched off.

When the negative voltage connected to the negative input pole Udc− is to be provided to the output Output of the gate driver and, simultaneously, of the control circuit, the lower current path of the gate driver A1, i.e. the current path from the negative auxiliary voltage input UA− to the output UAO of the gate driver, should be directed to be conducting by using the control input Ctrl. When the lower current path is conducting, owing to the potential difference between the positive and the negative input poles Udc+, Udc−, current starts flowing via a route formed by the first zener diode Z1, the lower current path of the gate driver and the second resistance R2. In the exemplary design, the threshold voltage of the zener diode Z1 is 15 volts, in which case when current flows through the zener diode, the voltage from its cathode to the anode drops by a corresponding voltage to the threshold voltage, i.e. 15 volts. Owing to the drop in voltage, the potential of the output UAO of the gate driver is 0 volts. On the lower current path of the gate driver in the exemplary design, owing to the characteristics of the gate driver, no significant current loss occurs, thereby the potential of the negative auxiliary voltage input UA− of the gate driver also being approximately 0 volts. Since the potential of said auxiliary voltage input is also transferred to the gate G of the semiconductor switch S2, and since the main electrode S of the semiconductor switch has a voltage of −7 volts connected to the negative input pole Udc− of the control circuit, the switch S2 is transferred to the conducting state, remaining therein until otherwise directed. When the switch S2 is conducting, the negative input voltage, which is −7 volts in the exemplary design, connected to the negative input pole Udc− is obtained to the output Output of the control circuit.

Simultaneously with the lower switch component S2 conducting, the higher switch component is in the blocking state. The blocking state is reached since the voltage drop caused by the idle current of the gate driver in the first resistance R1 is approximately 1 volt, whereby a voltage of approximately −1 volt is applied over the gate of the switch S1 and the main electrode S, this voltage retaining the component in the blocking state.

The control circuit of the invention can be utilized for example for reliably controlling inverters or power semiconductors of other such devices comprising high-current semiconductors. The circuit of the invention enables the positive and negative voltage necessary for controlling a power semiconductor, such as an IGBT or FET, to be generated in a reliable and cost efficient manner.

It is obvious to a person skilled in the art that the basic idea of the invention can be implemented in a variety of ways. The invention and its embodiments are thus not restricted to above-described examples, but they may vary within the scope of the claims.

What is claimed is:

1. A control circuit for controlling a power semiconductor comprising a gate driver including a control circuit input, auxiliary voltage inputs and an output, wherein the control circuit further comprises:

a first semiconductor switch including a control electrode and main electrodes, a first main electrode forming a positive input pole of the control circuit and a second main electrode forming an output of the control circuit;

a second semiconductor switch including a control electrode and main electrodes, a first main electrode forming a negative input pole of the control circuit and a second main electrode being connected to the output of the control circuit;

a first resistance including a first pole connected to the positive auxiliary voltage input of the gate driver and a second pole connected to the positive input pole of the control circuit, the positive auxiliary voltage input being arranged to control the first semiconductor switch;

a second resistance including a first pole connected to the negative auxiliary voltage input of the gate driver and a second pole is connected to the negative input pole of the control circuit, the negative auxiliary voltage input being arranged to control the second semiconductor switch;

a first zener diode including an anode connected to the output of the gate driver and a cathode connected to the positive input pole of the control circuit; and a second zener diode including a cathode connected to the output of the gate driver and a anode connected to the negative input pole of the control circuit.

2. A control circuit as claimed in claim 1, wherein the control circuit further comprises a capacitor connected between the auxiliary voltage inputs of the gate driver, a parallel connection of a third resistance and a first diode including a cathode and an anode, the parallel connection being connected between the control electrode of the first semiconductor switch and the positive auxiliary voltage input of the gate driver such that the cathode of the diode is connected to the control electrode; and a parallel connection of a fourth resistance and a second diode including an anode and a cathode, the parallel connection being connected between the control electrode of the second semiconductor switch and the negative auxiliary voltage input of the gate driver such that the anode of the diode is connected to the control electrode.

3. A control circuit as claimed in claim 1, wherein the first semiconductor switch comprises a p-channel FET transistor and the second semiconductor switch comprises an n-channel FET transistor.

* * * * *